(12) United States Patent
Tadayon

(10) Patent No.: US 12,032,002 B2
(45) Date of Patent: *Jul. 9, 2024

(54) CHEVRON INTERCONNECT FOR VERY FINE PITCH PROBING

(71) Applicant: Intel Corporation, Santa Clara, CA (US)

(72) Inventor: Pooya Tadayon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 143 days.

This patent is subject to a terminal disclaimer.

(21) Appl. No.: 17/677,847

(22) Filed: Feb. 22, 2022

(65) Prior Publication Data

US 2022/0178966 A1 Jun. 9, 2022

Related U.S. Application Data

(63) Continuation of application No. 15/640,415, filed on Jun. 30, 2017, now Pat. No. 11,268,983.

(51) Int. Cl.
*G01R 1/067* (2006.01)
*G01R 1/073* (2006.01)
*G01R 31/28* (2006.01)

(52) U.S. Cl.
CPC ....... *G01R 1/0675* (2013.01); *G01R 1/06716* (2013.01); *G01R 1/07314* (2013.01); *G01R 1/07357* (2013.01); *G01R 31/2889* (2013.01)

(58) Field of Classification Search
CPC ... G01R 1/00; G01R 1/02; G01R 1/06; G01R 1/067; G01R 1/06711; G01R 1/06716; G01R 1/06722; G01R 1/06733; G01R 1/0675; G01R 1/073; G01R 1/07307; G01R 1/07314; G01R 1/07342; G01R 1/07357; G01R 31/00; G01R 31/28; G01R 31/2851; G01R 31/2886; G01R 31/2889
USPC .......... 324/500, 537, 755.01, 755.04, 755.05
See application file for complete search history.

(56) References Cited

U.S. PATENT DOCUMENTS

| | | | |
|---|---|---|---|
| 3,622,387 A | 11/1971 | Grandadam | |
| 4,581,260 A | 4/1986 | Mawla | |
| 5,214,375 A * | 5/1993 | Ikeuchi | G01R 1/07342 324/755.05 |
| 5,307,560 A | 5/1994 | Aksu | |

(Continued)

FOREIGN PATENT DOCUMENTS

| | | | |
|---|---|---|---|
| EP | 0962776 | 12/1999 | |
| JP | 11-344510 | 12/1999 | |
| JP | 4031303 B2 * | 1/2008 | G01R 1/073 |

OTHER PUBLICATIONS

Final Office Action for U.S. Appl. No. 15/640,415, notified Oct. 6, 2020.

(Continued)

*Primary Examiner* — Hoai-An D. Nguyen
(74) *Attorney, Agent, or Firm* — Essential Patents Group, LLP

(57) ABSTRACT

An apparatus an apparatus comprising: a substrate having a plane; and an array of at least one conductive probe having a base affixed to the substrate, the at least one conductive probe having a major axis extending from the plane of the substrate and terminating at a tip, wherein the one or more conductive probes comprise at least three points that are non-collinear.

20 Claims, 9 Drawing Sheets

(56) References Cited

U.S. PATENT DOCUMENTS

| | | |
|---|---|---|
| 5,453,701 A | 9/1995 | Jensen et al. |
| 5,592,222 A | 1/1997 | Nakamura et al. |
| 5,635,848 A | 6/1997 | Hammond et al. |
| 5,747,999 A | 5/1998 | Yamaoka |
| 5,767,692 A | 6/1998 | Antonello et al. |
| 5,917,329 A | 6/1999 | Cadwallader et al. |
| 6,130,545 A | 10/2000 | Kiser et al. |
| 6,292,004 B1 | 9/2001 | Kocher |
| 6,356,090 B2 | 3/2002 | Deshayes |
| 6,441,315 B1 | 8/2002 | Eldridge et al. |
| 6,740,163 B1 | 5/2004 | Curtiss et al. |
| 6,759,859 B2 | 7/2004 | Deng et al. |
| 6,774,654 B2 | 8/2004 | Kanamaru et al. |
| 6,812,718 B1 | 11/2004 | Chong et al. |
| 7,064,566 B2 * | 6/2006 | Khandros ........... H01L 21/4889 |
| | | 324/755.05 |
| 7,189,077 B1 | 3/2007 | Eldridge et al. |
| 7,436,193 B2 | 10/2008 | Crippen |
| 7,566,228 B2 | 7/2009 | Chiu |
| 7,884,632 B2 | 2/2011 | Shiraishi et al. |
| 7,928,522 B2 | 4/2011 | Zhu et al. |
| 8,029,291 B2 | 10/2011 | Park |
| 8,233,974 B2 | 7/2012 | Ward et al. |
| 8,267,831 B1 | 9/2012 | Olsen et al. |
| 8,411,550 B2 | 4/2013 | Chou et al. |
| 9,227,324 B1 | 1/2016 | Abdul Rashid et al. |
| 11,099,212 B2 | 8/2021 | Bruner et al. |
| 2002/0024347 A1 | 2/2002 | Felici et al. |
| 2002/0163349 A1 | 11/2002 | Wada et al. |
| 2005/0051515 A1 | 3/2005 | Nam |
| 2005/0151547 A1 | 7/2005 | Machida et al. |
| 2005/0231855 A1 | 10/2005 | Tran |
| 2005/0263401 A1 | 12/2005 | Olsen et al. |
| 2006/0151614 A1 | 7/2006 | Nishizawa et al. |
| 2006/0152232 A1 | 7/2006 | Shvets et al. |
| 2006/0171425 A1 | 8/2006 | Lee et al. |
| 2006/0214674 A1 | 9/2006 | Lee et al. |
| 2007/0126435 A1 | 6/2007 | Eldridge et al. |
| 2007/0126440 A1 | 6/2007 | Hobbs et al. |
| 2007/0290371 A1 | 12/2007 | Chen |
| 2008/0074132 A1 | 3/2008 | Fan et al. |
| 2008/0088327 A1 | 4/2008 | Kister |
| 2008/0196474 A1 | 8/2008 | Di Stefano et al. |
| 2008/0204061 A1 | 8/2008 | Chartarifsky et al. |
| 2008/0231300 A1 | 9/2008 | Yamada et al. |
| 2008/0309363 A1 | 12/2008 | Jeon et al. |
| 2009/0056428 A1 | 3/2009 | King |
| 2009/0072851 A1 | 3/2009 | Namburi et al. |
| 2009/0219047 A1 | 9/2009 | Peterson et al. |
| 2009/0237099 A1 | 9/2009 | Garabedian et al. |
| 2009/0243645 A1 | 10/2009 | Shinkawata |
| 2010/0052715 A1 | 3/2010 | Beaman et al. |
| 2010/0066393 A1 | 3/2010 | Bottoms et al. |
| 2010/0079159 A1 | 4/2010 | Kemmerling |
| 2010/0276572 A1 | 11/2010 | Iwabuchi et al. |
| 2011/0031991 A1 | 2/2011 | Lee et al. |
| 2011/0115513 A1 | 5/2011 | Harada |
| 2011/0163773 A1 | 7/2011 | Zelder et al. |
| 2011/0234251 A1 | 9/2011 | Komatsu et al. |
| 2012/0038383 A1 | 2/2012 | Wu et al. |
| 2012/0071037 A1 | 3/2012 | Balucani |
| 2012/0100287 A1 | 4/2012 | Wong |
| 2012/0117799 A1 | 5/2012 | Luo |
| 2012/0146679 A1 | 6/2012 | Chang et al. |
| 2012/0286817 A1 * | 11/2012 | Duckworth ........ G01R 1/06711 |
| | | 324/755.01 |
| 2012/0319710 A1 | 12/2012 | Dabrowiecki et al. |
| 2013/0002285 A1 | 1/2013 | Nelson et al. |
| 2013/0099812 A1 | 4/2013 | Wang et al. |
| 2013/0200910 A1 | 8/2013 | Ellis-Monaghan et al. |
| 2013/0285688 A1 | 10/2013 | Namburi et al. |
| 2014/0002122 A1 | 1/2014 | Dibattista et al. |
| 2014/0021976 A1 | 1/2014 | Tanaka |
| 2014/0125372 A1 | 5/2014 | Fukasawa et al. |
| 2014/0132297 A1 | 5/2014 | Hwang et al. |
| 2014/0253162 A1 | 9/2014 | Wang |
| 2014/0347085 A1 | 11/2014 | Kuo et al. |
| 2014/0362425 A1 | 12/2014 | Stephens et al. |
| 2014/0363905 A1 | 12/2014 | Mcshane et al. |
| 2015/0015291 A1 | 1/2015 | Ku et al. |
| 2015/0033553 A1 | 2/2015 | Wu et al. |
| 2015/0123693 A1 | 5/2015 | Ota et al. |
| 2015/0192633 A1 | 7/2015 | Garibay et al. |
| 2015/0226783 A1 | 8/2015 | Kang |
| 2016/0079635 A1 | 3/2016 | Niwa |
| 2016/0178663 A1 | 6/2016 | Prabhugoud et al. |
| 2016/0223590 A1 | 8/2016 | Hsu et al. |
| 2017/0219626 A1 | 8/2017 | Gardell et al. |
| 2018/0003767 A1 | 1/2018 | Crippa et al. |
| 2018/0143222 A1 | 5/2018 | Lee et al. |
| 2019/0203370 A1 | 7/2019 | Walczyk et al. |
| 2019/0212366 A1 | 7/2019 | Tadayon et al. |
| 2020/0006868 A1 | 1/2020 | Tillotson, Jr. |
| 2020/0025801 A1 | 1/2020 | Tadayon et al. |
| 2021/0302489 A1 | 9/2021 | Tadayon |

OTHER PUBLICATIONS

Non-Final Office Action for U.S. Appl. No. 15/640,415, dated Jun. 30, 2017.
Non-Final Office Action for U.S. Appl. No. 15/640,415, notified Mar. 26, 2020.
Notice of Allowance for U.S. Appl. No. 15/640,415, dated Nov. 10, 2021.
Restriction Requirement for U.S. Appl. No. 15/640,415, notified on Sep. 20, 2019.
Darling, K.A., et al., "Mitigating grain growth in binary nanocrystalline alloys through solute selection based on thermodynamic stability maps", Computational Material Science; 84 (2014), 255-266.
Luo, J.K., et al., "Young's modulus of electroplated Ni thin film for MEMS applications", Materials Letters, vol. 58, Issues 17-18, Jul. 2004, pp. 2306-2309.
Weeden, et al., "Probe Card Tutorial", www.tek.com/keithley, 2003, 40 pages, Keithley Instruments, Inc.
Wikipedia, "Probe Card", last edited on Jul. 29, 2016, 2 pages, Wikipeadia, https://en.wikipedia.org/wiki/probe_card.

* cited by examiner

CHEVRON INTERCONNECT FOR VERY FINE PITCH PROBING

CLAIM FOR PRIORITY

This application is a continuation of, and claims the benefit of priority to U.S. patent application Ser. No. 15/640,415, filed on Jun. 30, 2017, titled "Chevron Interconnect for Very Fine Pitch Probing", and which is incorporated by reference in its entirety for all purposes.

BACKGROUND

Bump pitch dimensions continue to shrink for silicon wafers. State-of-the-art probe cards are rapidly becoming inadequate to meet more stringent demands placed on them due to smaller pitch requirements.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
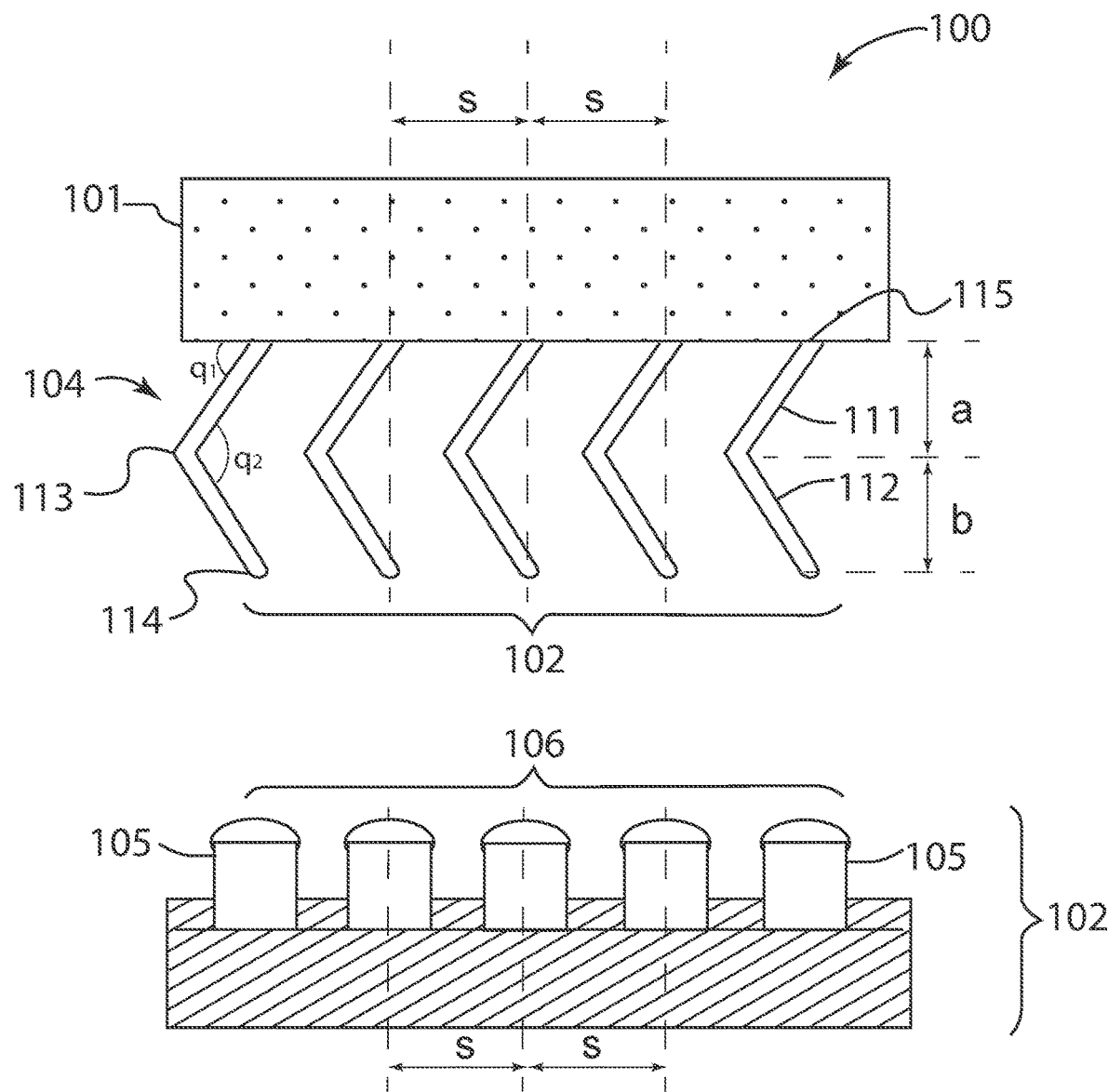
FIG. 1 illustrates a profile view of a probe card comprising a high-density array of chevron probes in pre-contact alignment over a high-density array of contact bumps of a die, according to some embodiments.

In the final stages of microelectronic device manufacture, whole silicon wafers carrying multiple integrated circuit (IC) and/or Microelectromechanical Systems (MEMS) devices are typically tested in probe stations, referred to as wafer probers. The wafer prober places a probe card carrying an array of individual probes in proximity of the wafer surface where the device is located. The probe array is designed to make simultaneous electrical contacts with corresponding arrays of individual bond (contact) pads or bumps on the wafer, where one or more bond pads/bumps function as test points for each IC die or MEMS device on the wafer. Typically, the ICs and MEMS devices are tested for trace and interconnect continuity, as well as device functionality.

As microelectronic device dimensions continue to scale to smaller dimensions, the dimensions of bond pad and/or bump arrays used for test probe contacts must scale to smaller dimensions and smaller pitch. The current trend in the microelectronics industry is to shrink center-to-center pitch of bond pad/bump arrays from an approximate average of 100 microns to below 40 microns as an industry standard. Modern and future probe cards must comply with this emerging standard by reducing the distance or pitch between adjacent probes, therefore there is a need to produce high-density probe arrays with sub-40 micron probe pitches. As a consequence, overall probe cross section, along with other dimensions, must be reduced to accommodate the shrinking pitch.

Two opposing requirements, both electrical and mechanical, govern the shape and size of probes as the pitch shrinks. First, the current carrying capacity (CCC) requirements of the individual probes is substantial, typically exceeding 500 milliamperes (0.5 A), and as much as 1 ampere (1 A). This requirement calls for short and thick probes to minimize probe resistance which can lead to rapid temperature rise and catastrophic failure of the probe. Second, the mechanical demand calls for compliant probe wires that have a small stiffness or spring constant to be able to make contact with the bond pad/bump without damaging it. This mechanical constraint would call for a long and thin wire form factor. Additionally, the probe wire must also be robust enough to withstand contact pressures required to establish a low-resistance contact with a bond pad/bump without sustaining permanent shape distortion of the probe wire due to bending.

Several problems associated with long thin probe form factors comes to mind initially. First, for a given material, such a form factor increases wire resistance and temperature rise of the probe. Second, long thin wires tend to have low stiffness, combined with the length, therefore low robustness. A large overdrive may be needed for establishing sufficient contact force. Overdrive is defined as the vertical movement of a probe after the probe tip makes contact with a device bond pad/bump and vertical compressive force is applied to make good electrical contact. The compressive force may permanently bend the probe. Another industry term related to overdrive is scrub. Scrub is the lateral distance the probe tip moves along the bond pad and/or substrate after touchdown of the probe, when contact force is applied. Large overdrive can result in large probe tip scrub, where the tip moves off of the bond pad. In cases where bond pads are covered by solder bumps, the risk of the tip sliding off the bump is increased.

Planarity is also relevant, where planarity is defined as the degree that the probe tips of a probe array are substantially in the same plane. The worse the planarity, the more contact force is needed to assure that all probes are contacting bond pads. Natural manufacturing variation of wire probes can result in probe arrays to exhibit relatively poor planarity that is not adequate for fine pitch applications.

For long, thin probe wires, overdrive and scrub are potentially large. The contact force must remain low enough to minimize scrub, as to prevent the probe tip from moving off of the contact area. If overdrive is large, compression may cause plastic deformation of the thin probe, rendering it useless for repeated contacts. However, low contact force may result in high contact resistance, significantly degrading the quality of the contact and the acquired test results. One solution to this dilemma that is currently known in the art is to introduce a "c" or "s" shaped segment in the middle of a relatively long wire in order to absorb some of the contact force and compression with minimal scrub.

Several problems have been identified for probe card manufacture when considering bond pad/bump pitches approaching 40 microns or less. In current methods, the probe wires are mechanically inserted into apertures drilled into a carrier substrate, manually or by a wire bonding apparatus or the like. The probe wires are typically long, up to 3000 microns (3 mm) or more in length. Small placement errors at the base of the probes may translate to large positional errors at the tip. At the current length, radial positional errors, that is, the error in the position of the tip relative to the base of the tip, can be as much as 15 microns.

For testing, the probe card is aligned with the bond pads/bumps of the device under test (DUT) such that the probe bases are placed directly over the bumps or contact pads. If there is no radial positional error, the probe tips are aligned with the bases of the probes and positioned directly over the bond pads. Due to natural variation in the verticality of the probe wires, probe tips may exhibit radial positional error. By a radial positional error of 15 microns, it is meant that the probe tip can be offset from the probe base within a radius of 15 microns on average, which may result in some probes not making an electrical contact, or a poor one, with the DUTs.

At the current industry average of a 100 micron bond pad pitch, this positional error may be acceptable due to the fact that the average pad/bump cross section is approximately 70 microns. A positional error of 15 microns is acceptable here as long as lateral scrub distances, combined with the positional error, do not exceed the dimensions of the bond pads or solder bumps. As bump pitch approaches 40 microns, the 15 micron radial positional error rapidly becomes unacceptable, as contact pad width must decrease to well below 40 microns. The scrub distances combined with the positional error may well exceed 40 microns, exceeding the dimensions of the bond pads or solder bumps. This results in the probe tip completely missing the pad or bump.

Second, planarity tolerances can be large with thin wire probes. Probe tip height variations above the carrier substrate surface may be up to several tens of microns. To compensate for the planarity variations, the probes need to be overdriven to make contact with all DUT contacts. The contact force necessary to do this may cause plastic deformation of some or all of the long, thin probes, destroying the spring action and permanently bending even a few of them, rendering the probe card useless.

The issues raised above have been addressed in a related international application, PCT/US16/68470, where a embodiments of a probe card have been proposed wherein robust probes comprising having short, thick straight wires having 40 micron or smaller probe pitch are cantilevered at an angle with respect to the plane of the probe carrier substrate from which the probe wires protrude. A typical vertical distance between probe tips and base (at the substrate surface) in the related application is less than 1000 microns. Wire thicknesses of up to 40 microns is also disclosed, permitting robust high-density probe arrays having the desired electrical and mechanical characteristics imbued in the individual probe wires.

The reclining cantilevering of the probe creates a spring action for the short, relatively thick wires, without the need to incorporate a special structural feature, such as the "c" shaped section, in the wire probes of the current technology to create an engineered spring component to the probes. In the embodiments disclosed in the related application, radial positional error has been significantly reduced in comparison to the current state of the art technology described above. The straight, cantilevered embodiments disclosed in PCT/US16/68470 permit relatively large contact forces to be applied without permanently deforming the probes, while maintaining robust probes meeting electrical and mechanical requirements for sub-40 micron pitches. While a significant improvement is obtained over long, thin probe wires, still a relatively large lateral scrub results from the fact that the probes are reclined at a steep angle from the vertical.

Disclosed herein is a further improvement of the embodiments described in related application PCT/US16/68470. Embodiments disclosed herein address the management of scrub distance for sub-40 micron pitch requirements, while maintaining the mechanical and electrical advantages garnered with the advances disclosed in the aforementioned related application PCT/US16/68470. In some embodiments, probe wires are non-linear, short (less than 500 microns vertical tip height above the base). Non-linear probe wire embodiments comprise one or more bends are engineered into the probe wire, creating, for example, a chevron shaped wire. In some non-linear embodiments, probe wires are curved, creating, for example, a C-shape or S-shape.

The herein-disclosed shape embodiments extend the advantages that the straight cantilevered probes of related application PCT/US16/68470 afford by providing short, robust probe wires that meet the electrical and mechanical requirements described above, but in addition, minimize lateral scrub. In some embodiments, horizontal movement of the tip is suppressed as the horizontal movements of portions of the probe wires are opposed when a contact force is applied. Electrical and mechanical requirements are met by maintaining the length of the probe wire at lengths of less than 500 microns, where the relative lengths of any straight segments or curvature of the probe wires, as well as probe cross section and bend angles, may be engineered to optimize electrical resistance, contact force, overdrive and scrub.

Mechanical production of probe cards having high-density (sub-40 micron pitch) arrays of non-linear short, robust probes (under 500 microns) can be difficult if not impossible. Some embodiments describe a manufacturing process for fabricating high-density arrays of probes having the disclosed shape embodiments. In some embodiments, probe cards may be produced by MEMS or related microfabrication techniques.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification and in the claims, the abbreviation "DUT" stands for "Device Under Test". A DUT may be one or more conductive traces, a single electronic component of an integrated circuit (IC), such as a transistor, or a portion of a single integrated circuit, including MEMS devices. DUT may also refer to an entire integrated circuit, referred to as a "chip" or die. DUT may also refer to an entire wafer that carries multiple dies or integrated circuits. In the context of this disclosure, a DUT is the device subject to back-end fab testing of completed integrated circuits on probe stations or wafer probers employing probe cards, before or after packaging, and before or after singulation. The term "singulation" refers to dividing a wafer into individual dies.

"Bond pad" is a term referring to electrical contact pads in association with test points or external electrical connections of an integrated electronic device such as an IC or MEMS device. Related industry terms are "contact pad" and "bump". "Solder bump" or "bump" is a ball of solder bonded to a bond pad for further assembly of the die into packages by use of surface mount technology, or for wire bonding. Probes from probe cards make contact with bond pads or bumps, which are typically organized in one or two dimensional arrays on the DUT.

The term "probe" refers to a wire or elongated metal extension engineered to make electrical contact with a bond pad on a DUT. For making multiple contacts on a DUT simultaneously, an array of probes is employed. A probe card is a substrate that carries arrays of one or more probes. A probe station, or wafer prober, is an apparatus for testing DUTs in the final stages of fabrication. Probe stations are engineered for precision alignment of the probe array carried on a probe card with the bond pad array on the DUT, as well as providing a readout of signals from the DUT by the intermediary of the probe array. For wafers, the probe station may move the probe card to each of multiple DUTs carried on the wafer.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "profile" and "plan" correspond to a orthogonal planes within a cartesian coordinate system. Thus, profile views are taken in the x-z plane, and plan views are taken in the x-y plane. Typically, profile views in the x-z plane are cross-sectional views.

FIG. 1 illustrates a profile view of probe card 100 comprising a high-density array of chevron probes in pre-contact alignment over a high-density array of contact bumps of a die, according to some embodiments.

Probe card 100 comprises substrate 101 and probe array 102, ad is shown in an implementation where probes of high-density probe array 102 is positioned over DUT 103 where, in some embodiments, individual probes 104 of probe array 102 have a base-to-base pitch 's', a major axis extending from the base of probes 104 to tips 114, and are aligned with individual bond pads 105 of high-density bond pad array 106 protruding from DUT die surface 107 In some embodiments, high-density bond pad array has a center-to-center pitch 's'. In some embodiments, center-to-center pitch 's' is less than 100 microns. In some embodiments, pitch 's' is less than 40 microns. In some embodiments, individual probes 104 comprise first and second segments 111 and 112 joined at angled elbow 113, forming a chevron configuration. In some embodiments, first segment 111 forms angle $\theta_1$ with substrate 101. In some embodiments, elbow 113 is bent at an angle $\theta_2$, as shown in FIG. 1.

In some embodiments, first and second segments 111 and 112 have independently variable lengths. In some embodiments, angle $\theta_1$ is variable. The height 'h' of individual probes 104 is measured from the surface of substrate 101 to the tips of probes 104. In some embodiments, height 'h' is dependent on the lengths of first and second segments 111 and 112 as well as angles $\theta_1$ and $\theta_2$. In some embodiments, probe tip 114 and probe base 115 are substantially in vertical alignment so that tip 114 is disposed substantially over probe base 115. This is indicated by the vertical broken lines in FIG. 1. In some embodiments, these parameters, as well as probe thickness 'd', may be engineered to produce probes that have desired characteristics, such as current carrying capacity (CCC), spring constant, contact force, overdrive and scrub. Choice of material from which the probes in part determine electrical and mechanical characteristics.

Figure 2A:
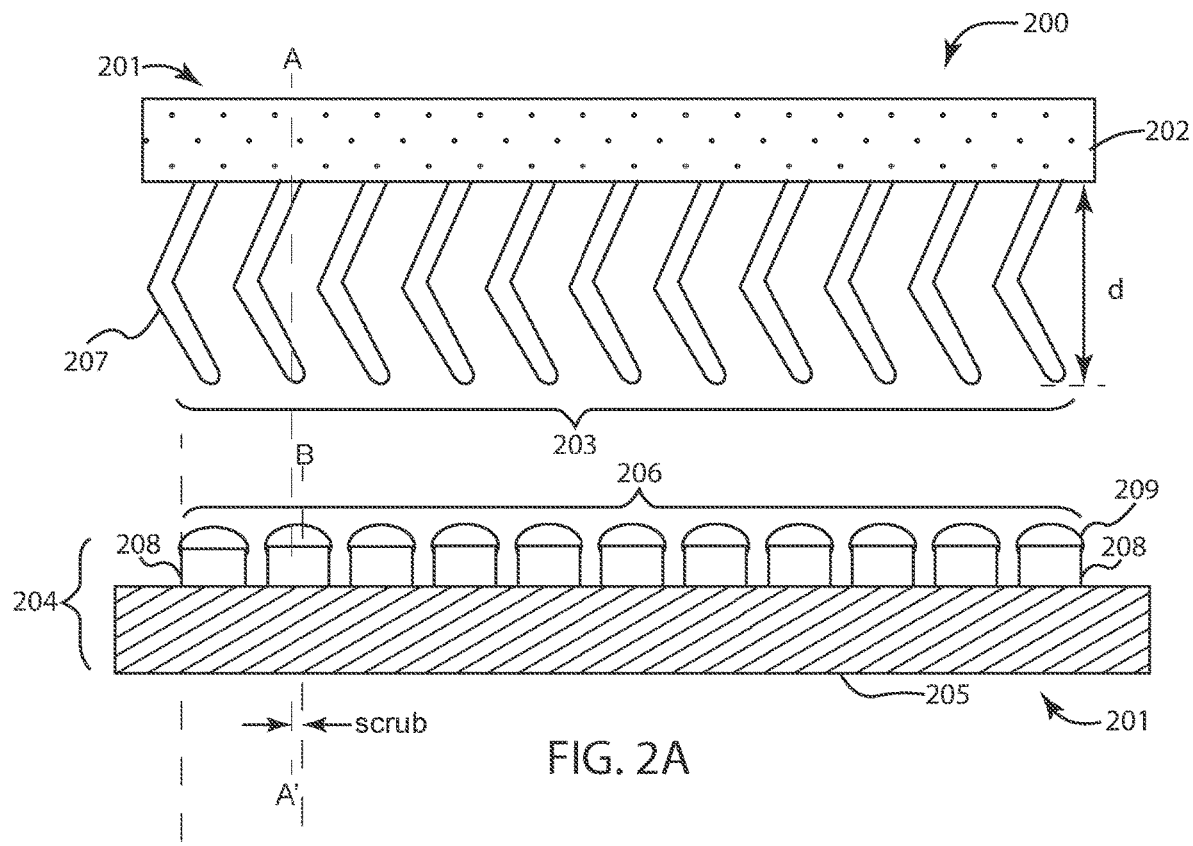
FIG. 2A illustrates a profile view of a probe card having an array of chevron-shaped probes in pre-contact alignment with a device-under-test (DUT) having an array of electrical contact bumps, according to some embodiments.

FIG. 2A illustrates a profile view 200 of probe card 201 having an array of chevron-shaped probes in pre-contact alignment with a DUT having an array of electrical contact bumps, according to some embodiments.

In FIG. 2A, probe card 201 comprises substrate 202 carrying probe array 203. Shown immediately below probe card 201 is DUT 204, comprising substrate 205 carrying contact array 206. In FIG. 2A, probe cared 201 is in a pre-contact alignment with DUT 204. In some embodiments, probe array 203 is aligned with array 206 of bond pads 208 such that probe tip centers are substantially in coincidence with contact centers. In some embodiments, solder bumps 209 are bonded to bond pads 208. Chevron-shaped probes 207 are fully extended such that elbow angle is $\theta_2$ and height, defined as the distance between probe tips and surface of substrate. The vertical dashed lines extend through both probe base and tip, indicating the probe tips are substantially centered over the probe bases, according to some embodiments. In this way, compression of chevron-shaped probes 207 upon contact with a DUT will cause the elbow (e.g., 113 in FIG. 1) to bend and extend laterally to the left in the figure, mitigating lateral displacement (scrub) of the probe tips in the opposite direction, or to the right in the figure.

Figure 2B:
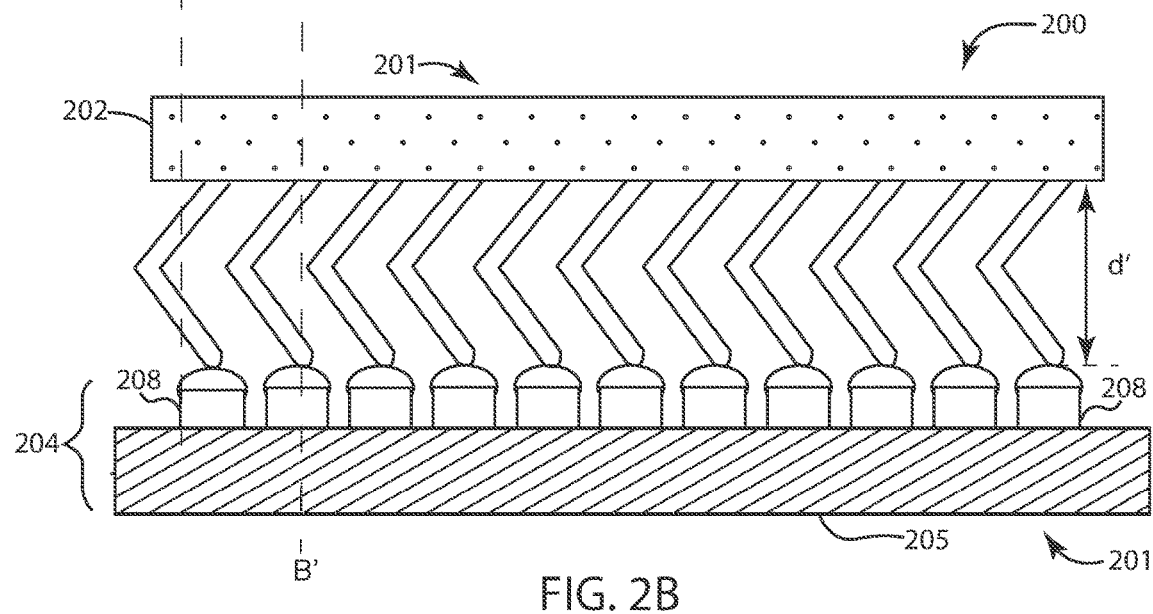
FIG. 2B illustrates a profile view of a probe card having an array of chevron-shaped probes in contact with a DUT having an array of electrical contact bumps, according to some embodiments.

FIG. 2B illustrates a profile view 200 of probe card 201 having an array of chevron-shaped probes in contact with a DUT having an array of electrical contact bumps, according to some embodiments.

In FIG. 2B, probe card 201 is shown as having been moved vertically to establish electrical and mechanical contact with DUT 204. In some embodiments and as explained for FIG. 1, bending of chevron elbow (e.g., 113 of FIG. 1) is accompanied by lateral extension of the elbow toward the left in the figure, counteracting any tendency for lateral displacement of the probe tip toward the right of the figure. Referring back to FIG. 2A, according to some embodiments, lateral scrub is restricted such that the probe tips tendency to wander off of contacts 206 is mitigated. According to some embodiments, the chevron design permits larger contact forces to be used in order to reduce contact resistance. Referring again to FIG. 2B, the preceding description is shown by chevron elbow bend angle $\theta_2'$, where $\theta_2' > \theta_2$. In addition, chevron probe height "d", the vertical distance of probe tips from the surface of substrate 202 when probes are in contact with DUT 204, is less than 'd'. The difference d-d' is the probe overdrive, according to some embodiments. Also shown in FIG. 2B is the lateral displacement of the chevron probe tips when in contact with DUT 204, indicated by the displacement of dashed lines A-A' and B-B'. ( )

Figure 3:
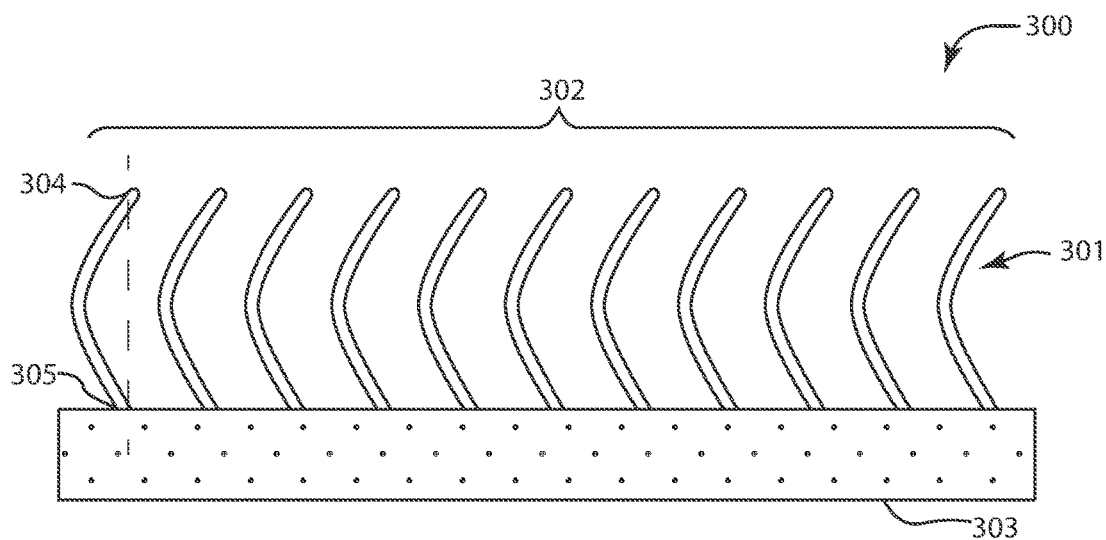
FIG. 3 illustrates a profile view of a probe card comprising an array of probes having a curved shape, according to some embodiments.

FIG. 3 illustrates a profile view of probe card 300 comprising an array of probes having a curved shape, according to some embodiments.

In some embodiments, probes 301 of probe array 302 are rounded to form a curved profile. In some embodiments, probes 301 are formed into a smooth curve shape or boomerang shape. In some embodiments, probes 301 are formed into a "C"-shape. In some embodiments, probe tips 304 are substantially aligned with probe bases 305, where probe bases are affixed to substrate 303 of probe card 300. This is indicated in FIG. 3 by the vertical dashed line extending through both probe tip 304 and probe base 305. In some embodiments, the curved shape of probes 301 performs functionally the same or in a similar fashion as the chevron probes described in FIGS. 1-2B.

Figure 4:
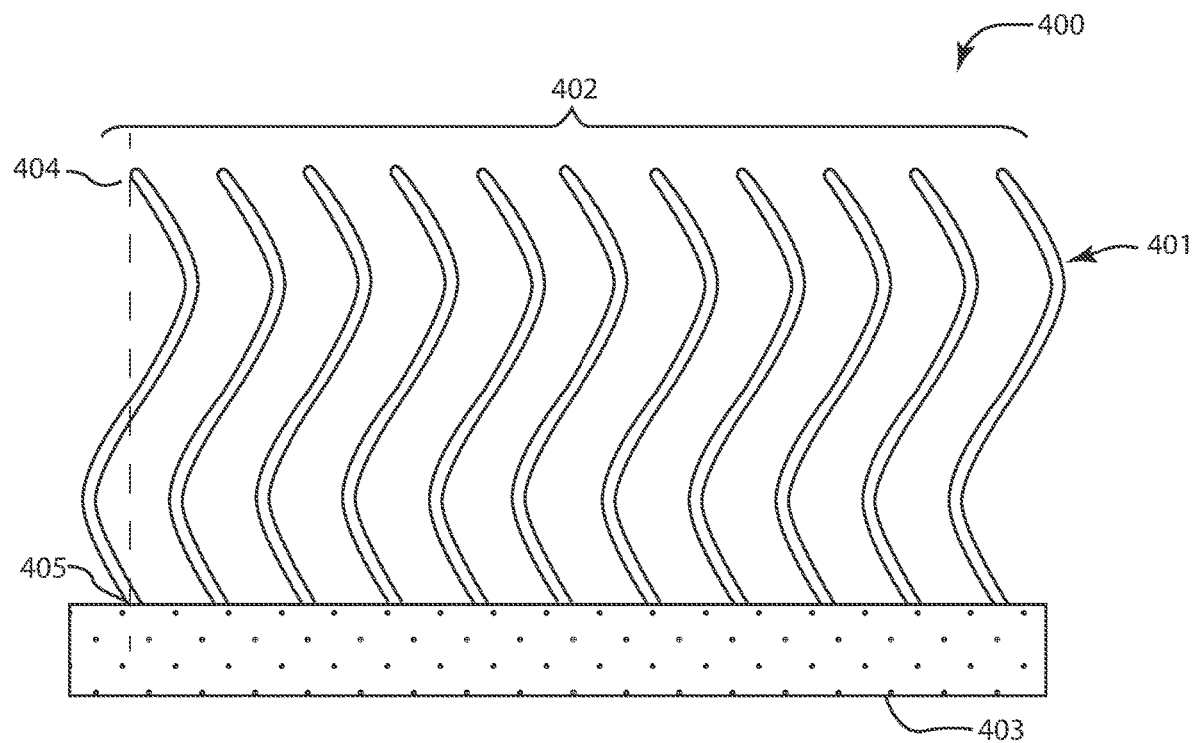
FIG. 4 illustrates a profile view of a probe card comprising an array of probes having a stacked curve (s-shaped) configuration, according to some embodiments.

FIG. 4 illustrates a profile view of probe card 400 comprising an array of probes having a meandering curve (s-shape) configuration, according to some embodiments.

In some embodiments, probes 401 of probe array 402 are rounded to form a stacked curve profile. In some embodiments, probes 401 are formed into a S-shape or meandering shape. In some embodiments, probe tips 404 are substantially aligned with probe bases 405, where probe bases 405 are affixed to substrate 403 of probe card 400. This is indicated in FIG. 4 by the vertical dashed line extending through both probe tip 404 and probe base 405. In some embodiments, the curved shape of probes 401 performs functionally the same or in a similar fashion as the chevron probes described in FIGS. 1-2B.

Figure 5:
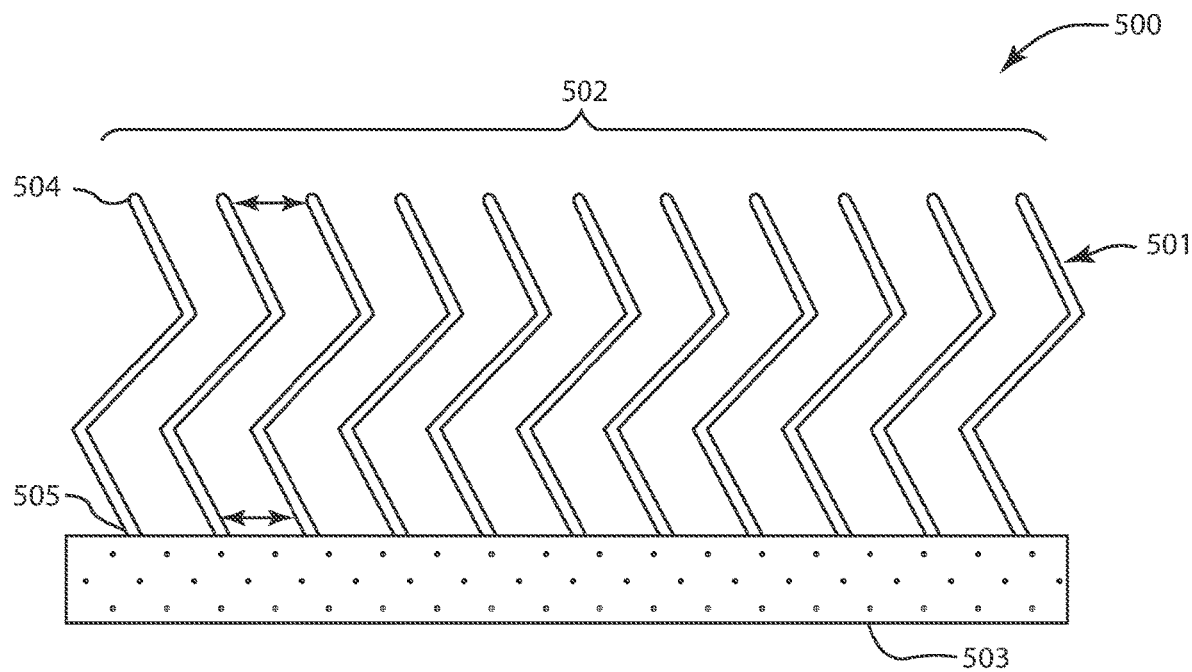
FIG. 5 illustrates a profile view of a probe card comprising an array of probes having a meandering chevron configuration, according to some embodiments.

FIG. 5 illustrates a profile view of probe card 500 comprising an array of probes having a zig-zag configuration, according to some embodiments.

In some embodiments, probes 501 of probe array 502 are shaped in a zig-zag profile, where two elbow angles subtended by three straight wire segments are coplanar. In some embodiments, probe tips 504 are substantially aligned with probe bases 505, where probe bases 505 are affixed to substrate 503 of probe card 500. This is indicated in FIG. 5 by the vertical dashed line extending through both probe tip 504 and probe base 505. The double headed arrows in FIG. 5 indicate that the pitch is maintained from base to tip in some embodiments. In some embodiments, the zig-zag shape of probes 501 performs functionally the same or in a similar fashion as the chevron probes described in FIGS. 1-2B.

Figure 6:
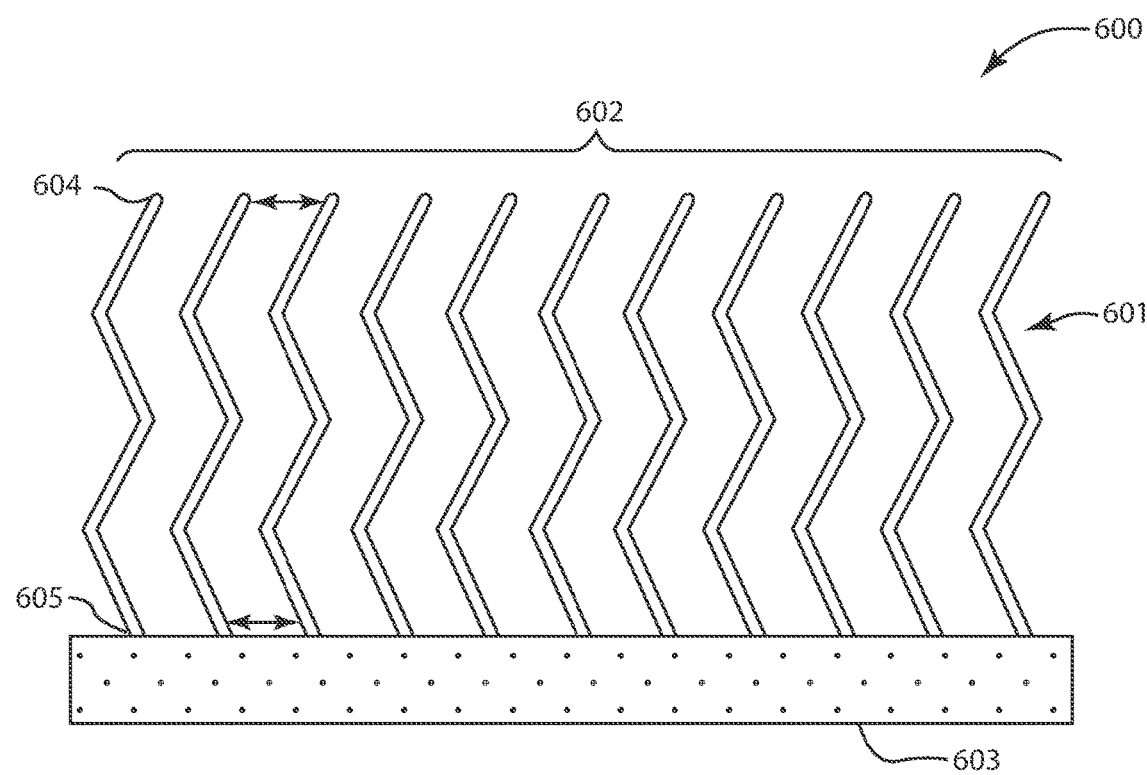
FIG. 6 illustrates a profile view of probe card 600 comprising an array of probes having a meandering chevron configuration, according to some embodiments.

FIG. 6 illustrates a profile view of probe card 600 comprising an array of probes having a meandering chevron configuration, according to some embodiments.

In some embodiments, probes 601 of probe array 602 are shaped in a stacked chevron profile, where three elbow angles are subtended by four non-collinear straight wire segments connected end-to-end. In some embodiments, the four non-collinear segments are coplanar, where two coplanar chevron-shaped structural elements are connected end-to-end in a chain extending along the major axis of the probe wire. In some embodiments, probes 601 are formed into an extended zig-zag shape, where more than four non-collinear wire segments are connected end to end. In some embodiments, the probes 601 comprise at least three chevron-shaped structural elements are connected end-to-end in a chain extending along the major axis of the probe wire. In some embodiments, probe tips 604 are substantially aligned with probe bases 605, where probe bases 605 are affixed to substrate 603 of probe card 600. This is indicated in FIG. 6 by the vertical dashed line extending through both probe tip 604 and probe base 605. The double headed arrows in FIG. 6 indicate that the pitch is maintained from base to tip in some embodiments. In some embodiments, the curved shape of probes 601 performs functionally the same or in a similar fashion as the chevron probes described in FIGS. 1-2B.

Figure 7A:
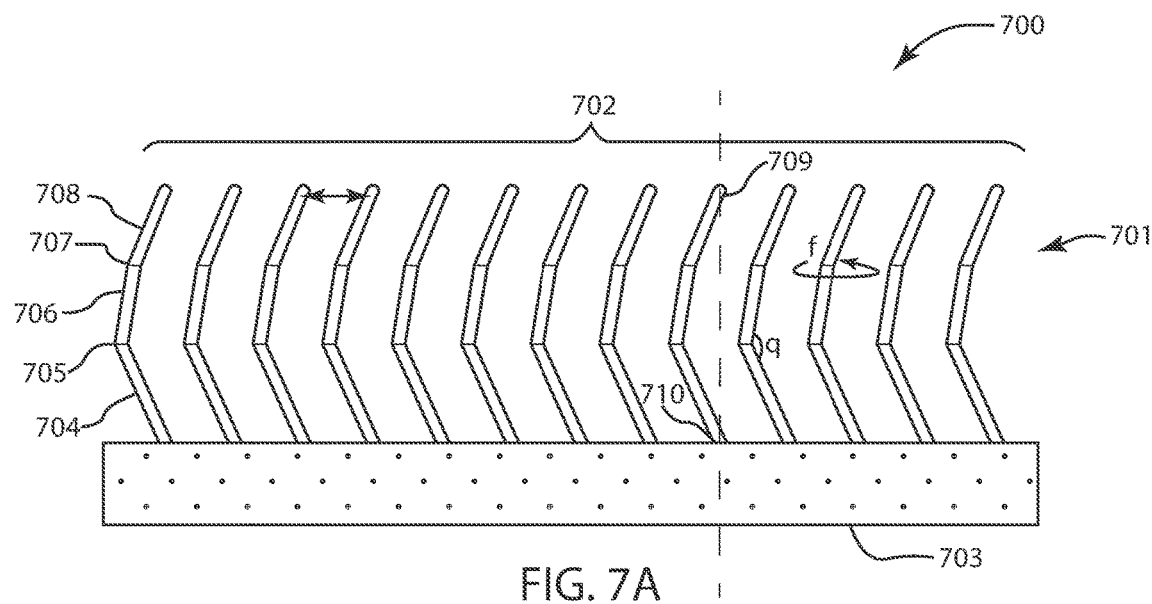
FIG. 7A illustrates a profile view of a probe card comprising an array of interconnects having a spiral configuration, according to some embodiments.

FIG. 7A illustrates a profile view of probe card 700 comprising an array of probes having a spiral configuration, according to some embodiments.

The view presented in FIG. 7A depicts probes 701 of probe array 702 as having a spiral or helical configuration where elbows 705 and 707 are not coplanar, according to some embodiments. In some embodiments, two angles of rotation are included with each elbow 705 and 707, one being the zenith rotational angle $\theta$ and azimuthal rotational angle $\phi$. In some embodiments, non-coplanar first and second probe segments 704 and 706 are joined at elbow 705, whereas non-coplanar second and third probe segments 706 and 708 are joined at elbow 707, according to some embodiments. In FIG. 7A, the vertical dashed line extends through probe tip 709 and probe base 710, according to some embodiments.

Figure 7B:
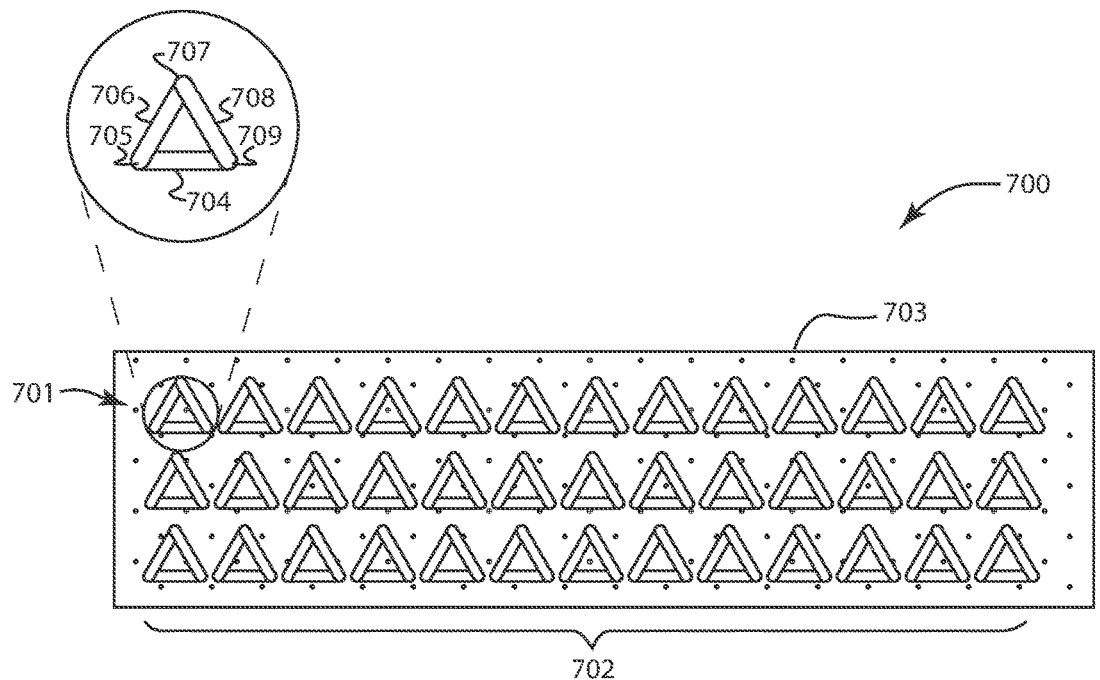
FIG. 7B illustrates a plan view of a probe card comprising an array of interconnects having a spiral configuration, according to some embodiments.

FIG. 7B illustrates a plane view of probe card 700 comprising an array of probes having a spiral configuration, according to some embodiments.

The view presented in FIG. 7B depicts a plane view of probe card 700 and probe array 702, where the spiral shape of probes 701 is shown more clearly. The inset of FIG. 7B is an enlargement of one member of probe array 702 to more clearly show the features. In some embodiments, first segment 704 is shown in a horizontal orientation in the figure, terminating at elbow 705. In some embodiments, second probe segment 706 extends from elbow 705, is rotated along azimuthal angle phi, appearing in the plane view to extend upwards in the figure at an angle towards the right in the figure, terminating at elbow 707. In some embodiments, second probe segment 706 is also rotated along zenith angle theta, extending vertically along the z-axis of the figure. In some embodiments, third probe segment 708 is rotated again along azimuthal angle phi and zenith angle theta to extend again vertically along the z-axis, appearing in the plane view to extend downward in the figure from elbow 707, and terminates at probe tip 709, disposed above probe base 710, (not visible in the figure), according to some embodiments. In some embodiments, the helical shape of probes 701 performs functionally the same or in a similar fashion as the chevron probes described in FIGS. 1-2B.

Referring back to FIG. 7B, in some embodiments, elbows 705 and 707 may be rounded. In some embodiments, probe segments 704, 706 and 708 may be curved. In some embodiments, rounded elbows and curved segments may be combined to form smooth spiral or helical probes 701. In some embodiments, more segments and elbows may be added to form helices having more than two elbows and more than three segments.

FIGS. 8A-8H illustrate a process 800 to fabricate a probe card comprising an array of chevron-shaped probes, according to some embodiments.

According to some embodiments, several manufacturing methods may be employed to fabricate probe cards carrying the probe embodiments described in this disclosure. In some embodiments, mechanical placement of pre-formed probe wires into apertures in a probe card substrate may be accomplished either manually, using a wire bonder, or some other automated mechanism. Particularly for complicated configurations of the probes, such as the curved forms described above, three dimensional (3D) printing techniques may be used for producing all embodiments of probes described in this disclosure, according to some embodiments. 3D printing is capable of producing conductive metal structures, and may be used to grow high-density probe (sub-100 micron pitch) arrays on suitable substrates, growing all probes wires simultaneously. As well, lithographic methods, such as a MEMS build-up process, may be used to produce chevron and helical shapes, according to some embodiments. In some embodiments, high-density arrays of short probes (less than 1000 microns height above substrate level) may be similarly grown by microfabrication methods. In some embodiments, excellent probe uniformity and planarity may be achieved.

Figure 8A:
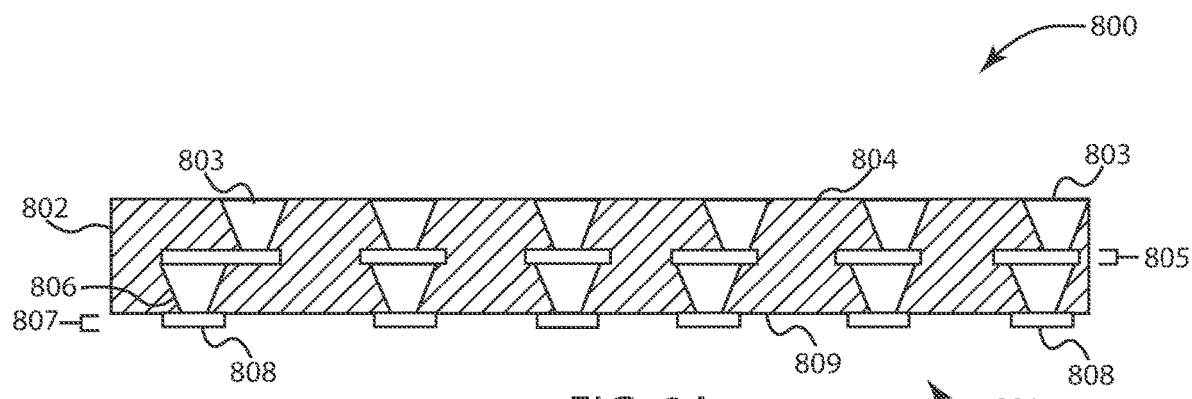
FIGS. 8A-8H illustrate a process to fabricate a probe card comprising an array of chevron-shaped probes, according to some embodiments.

According to some embodiments, a microfabrication MEMS build-up process for producing a high-density array of short chevron probes is shown in FIGS. 8A-8H, where a build-up process is shown for a pre-metallized probe card substrate 801 in cross-sectional view. In some embodiments, probe card substrate 801 is prepared by forming metal trace routing and/or vias interconnecting conducting structures on opposite sides of substrate 801 as shown in FIG. 8A. In some embodiments, probe card substrate 801 may be a printed circuit board, a organic multi-layer package, or a ceramic multi-layer package. In some embodiments, probe card substrate 801 may be silicon wafer or die. In some embodiments, probe card substrate may be a silicon nitride wafer or die. In some embodiments, probe card substrate 801 may be a float glass or borosilicate wafer or die. In some embodiments, probe card substrate 801 may be a fused silica wafer or die. In some embodiments, probe card substrate 801 may be a silicon on insulator wafer or die. In some embodiments, probe card substrate 801 may be a multilayer package produced by a package buildup process, such as by using the Bumpless Build-Up Layer (BBUL) process.

In some embodiments, probe card substrate 801 may be prepared with vias interconnecting two or more conductive levels. Referring back to FIG. 8A, probe card 801 comprises dielectric 802, according to some embodiments. In some embodiments, a first plurality of vias 803 is embedded in dielectric 802. In some embodiments, vias 803 extend between upper surface 804 and first conductive level 805, also embedded in dielectric 802. In some embodiments, traces have been patterned in first conducive level 805. In some embodiments, trace patterning in first conductive level 805 is accomplished in earlier steps that are omitted for clarity. In some embodiments, vias 803 are coplanar with upper surface 804.

In some embodiments, embedded vias 803 are intended to connect future probe wires that are to be fabricated in succeeding process steps to trace routing in first conductive level 805. In some embodiments, second plurality of embedded vias 806 connects patterned trace routing formed in first conductive level 805 to second conductive level 807. In some embodiments, second conductive level 807 is patterned into traces 808 and disposed on lower surface 809 of probe card substrate dielectric 802, where traces 808 are disposed on an outer surface of probe card 801. As indicted in FIG. 8A, traces 808 are to be in electrical communication with probe wires to be grown in succeeding process steps, and may be used as interconnecting contacts for attaching processed probe card substrate 801 to a probe station, according to some embodiments.

Figure 8B:
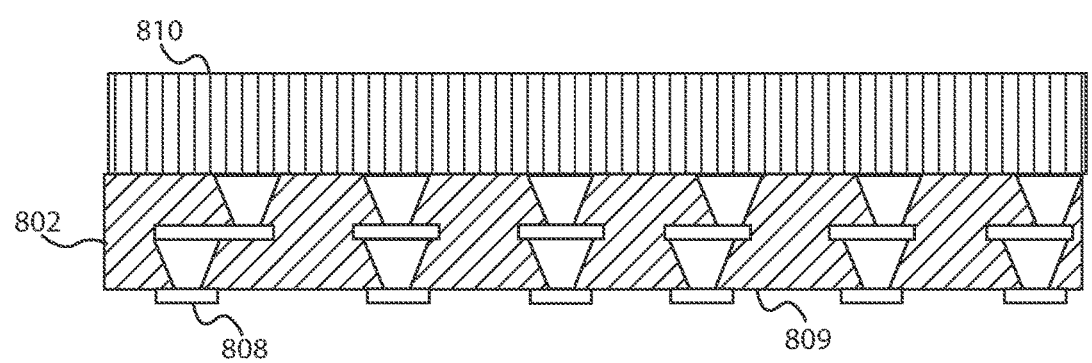

In FIG. 8B, first thick resist layer 810 is deposited over upper surface 804 of probe card substrate 801, according to some embodiments. In some embodiments, thick resist 810 may be deposited in a single application. In some embodiments, first thick resist layer 810 may be deposited in multiple applications. In some embodiments, first thick resist layer 810 may be a dry laminate photoresist. In some embodiments, first thick resist layer 810 may be a high viscosity liquid resin photoresist.

Figure 8C:
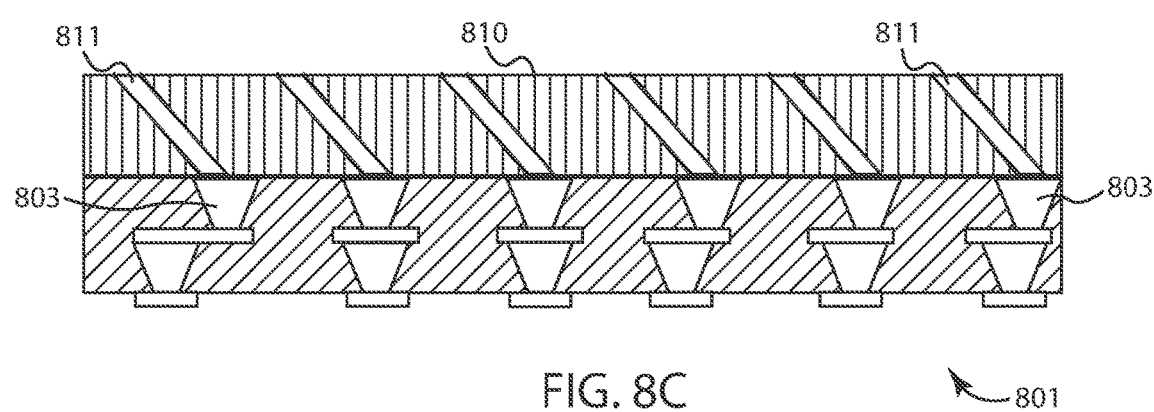

In FIG. 8C, first thick resist layer 810 is patterned with a first plurality of angled (slanted) apertures 811, where apertures 811 are formed at a non-perpendicular angle with respect to surface 804, extending through first thick resist layer 810 from upper surface 804 of probe card substrate 801 to the top surface of first thick resist layer 810, according to some embodiments. In some embodiments, apertures 811 terminate over tops of vias 803. Patterning may be accomplished by photolithographic methods to open the plurality of slanted apertures 811, according to some embodiments. In some embodiments, slanted apertures 811 may be formed by laser drilling techniques. In some embodiments, slanted apertures 811 may be formed by plasma etching techniques. In some embodiments, apertures 811 are to be filled with metal forming the first wire segment of chevron-shaped wire probes. In some embodiments, the slant angle and thickness of first thick resist layer 810 determine the length and tilt angles of first wire segments.

Figure 8D:
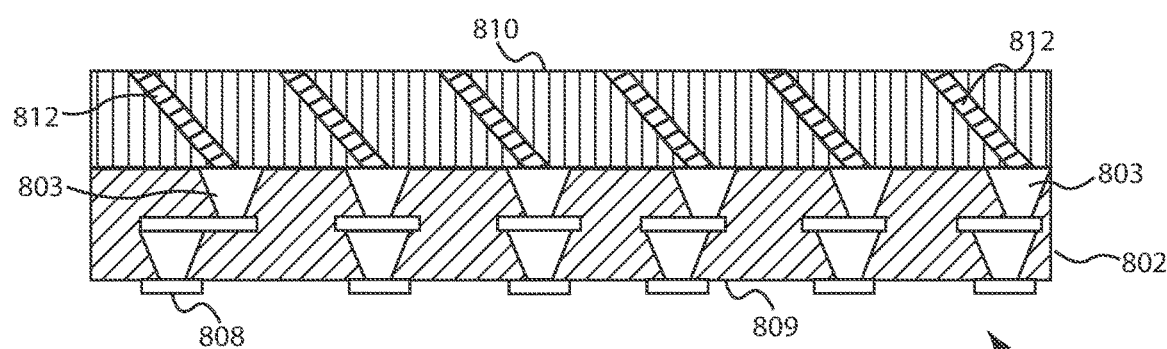

In FIG. 8D, a first plurality of slanted metal wires 812 are deposited in the first plurality of slanted apertures 811, according to some embodiments. In some embodiments wires 812 are chemically bonded to tops of vias 803. In some embodiments, metal wires 812 may be deposited by electrochemical processes, such as galvanic plating or electroless deposition. In some embodiments, metal wires 812 may be deposited by vacuum techniques, such as sputtering. In some embodiments, metal wires may be deposited by vapor phase techniques, such as Plasma-Enhanced Chemical Vapor Deposition (PECVD) [ . . . In some embodiments, metal wires 812 may be composed of a high conductivity, high yield strength metal. In some embodiments, metal wires 812 are composed of nickel or nickel alloys. In some embodiments, metal wires are composed of copper or copper alloys. In some embodiments, metal wires 812 are composed of beryllium copper alloys. In some embodiments, metal wires 812 are composed of tungsten and tungsten alloys. In some embodiments, metal wires 812 are composed of cobalt and cobalt alloys.

Figure 8E:
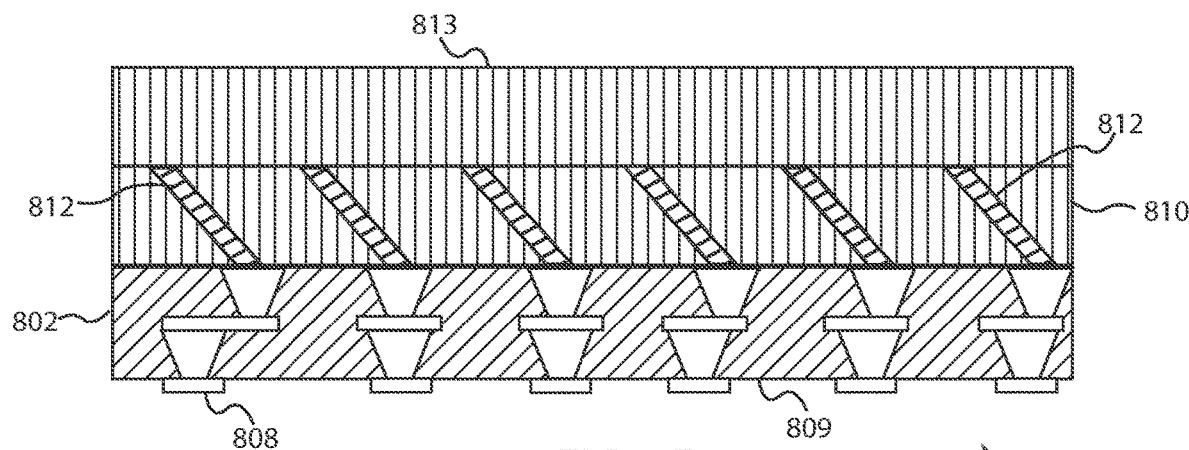

In FIG. 8E, second thick resist layer 813 is deposited over the upper surface of metallized first thick resist layer 810, according to some embodiments. In some embodiments, second thick resist layer 813 may have substantially the same composition and is deposited by the same method as first thick resist layer 810. In some embodiments, second thick resist layer 813 may have a different composition and deposition method. In some embodiments, second thick resist layer 813 has an adjustable thickness.

Figure 8F:
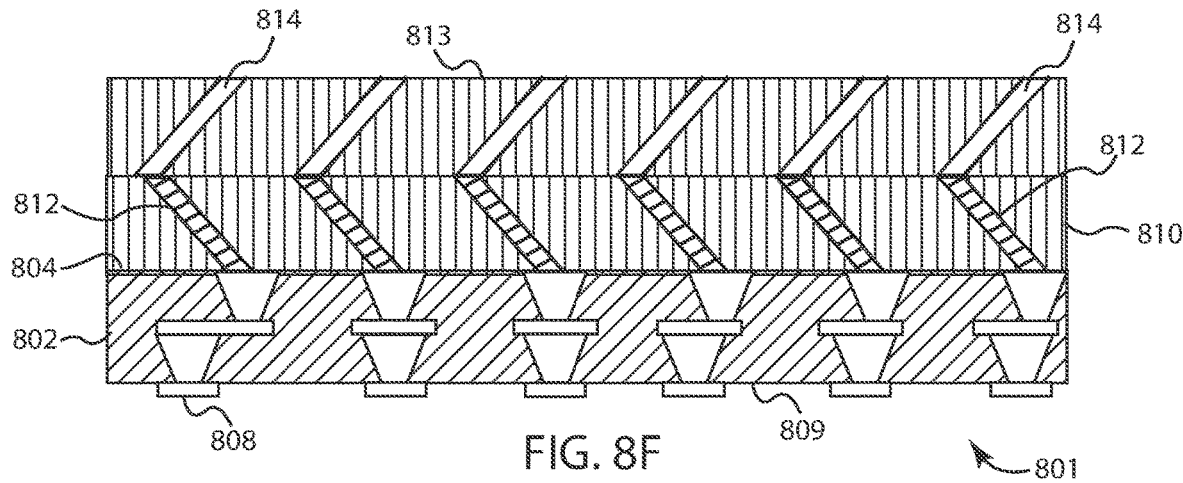

In FIG. 8F, a second plurality of angled or slanted apertures 814 is formed in second thick resist layer 813, according to some embodiments. In some embodiments, apertures 814 are to be filled with metal forming the second wire segment of chevron-shaped wire probes. In some embodiments, apertures 814 have a slant angle with respect to probe card substrate surface 804 that is opposite that of first plurality of slanted apertures 810. In some embodiments, apertures 814 extend through the thickness of second thick resist layer 813 and terminate over the tops of wires 812. In some embodiments, apertures 814 are coplanar with wires 812. In some embodiments, apertures 814 are not coplanar with wires 812. In some embodiments, apertures 814 are made by the same process steps as apertures 812 of the first plurality of apertures. In some embodiments, the slant angle and thickness of second thick resist layer 813 determine the length and tilt angles of second wire segments.

Figure 8G:
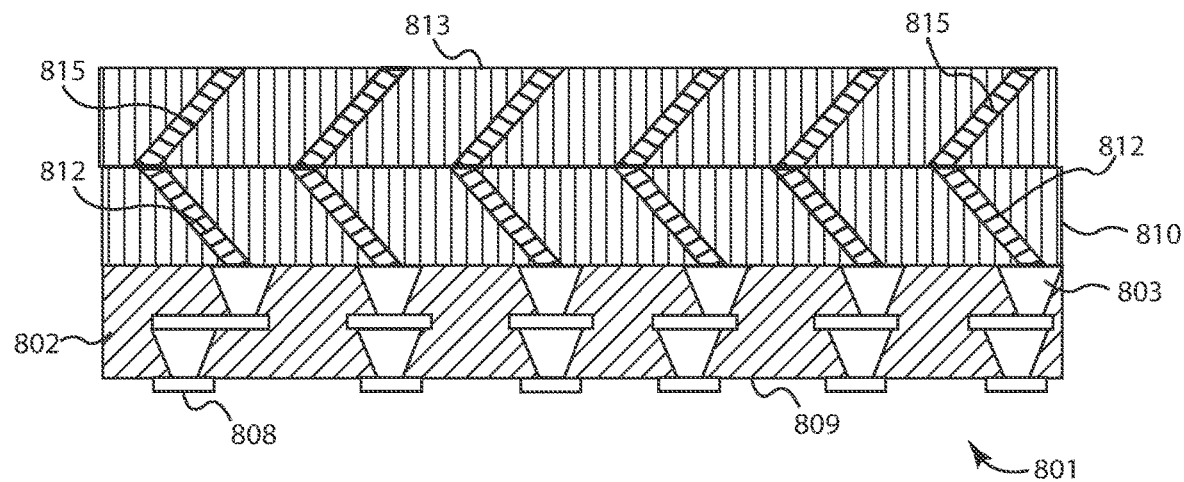

In FIG. 8G, a second plurality of wires 815 is deposited in apertures 814, according to some embodiments. In some embodiments, second wires 815 are chemically bonded to first wires 812, forming contiguous chevron-shaped wires extending from tops of vias 803 to the top surface of second thick resist layer 813. In some embodiments, second wires 815 are coplanar with the top surface of second thick resist layer 813. In some embodiments, second wires 815 are deposited with the same techniques as used in deposition of first plurality of wires 812. In some embodiments, second wires 815 have the same composition of first wires 812.

Figure 8H:
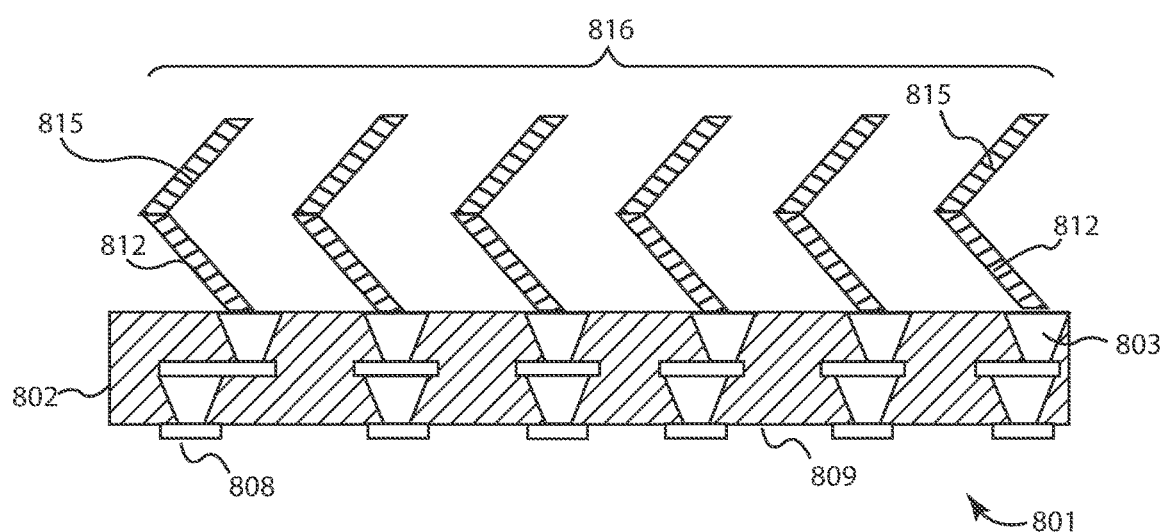

In FIG. 8H, first and second thick resist layers 809 and 812 are removed, freeing chevron-shaped probe array 816, according to some embodiments. In some embodiments, chevron-shaped probes 816 are chemically bonded to vias 803. In some embodiments, the height of probes 816 is the sum of thicknesses of first and second thick resist layers 809 and 812.

Figure 9:
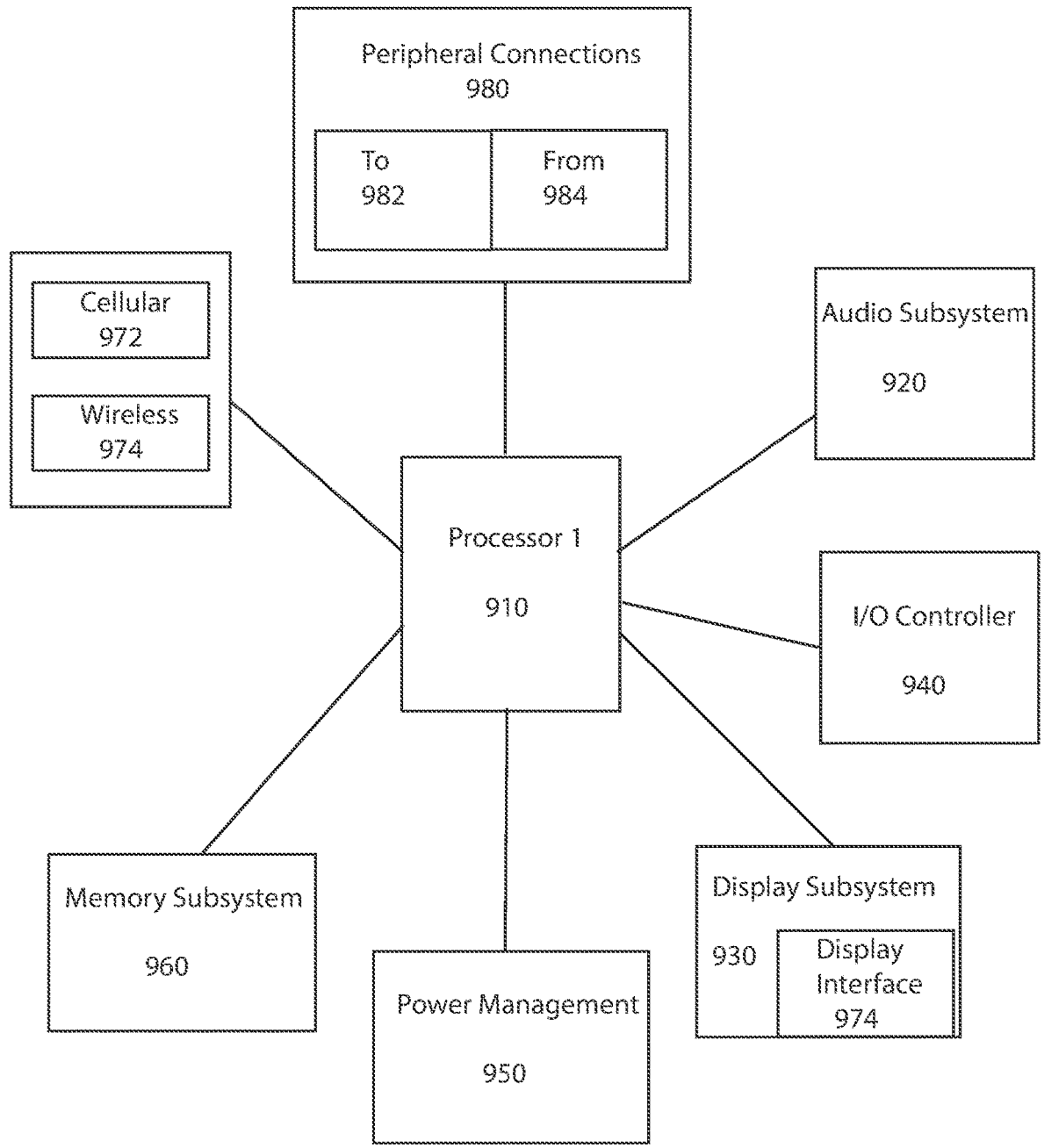
FIG. 9 illustrates a DUT to be coupled to the probe card, according to some embodiments of the disclosure.

FIG. 9 illustrates a DUT to be coupled to the probe card, according to some embodiments of the disclosure.

FIG. 9 illustrates a smart device or a computer system or a SoC (System-on-Chip) 900 (e.g., DUT 103 or 204) It is pointed out that those elements of FIG. 9 having the same reference numbers (or names) as the elements of any other figure can operate or function in any manner similar to that described, but are not limited to such.

FIG. 9 illustrates a block diagram of an embodiment of a mobile device in which flat surface interface connectors could be used. In some embodiments, computing device 900 represents a mobile computing device, such as a computing tablet, a mobile phone or smart-phone, a wireless-enabled e-reader, or other wireless mobile device. It will be understood that certain components are shown generally, and not all components of such a device are shown in computing device 900.

For purposes of the embodiments, the transistor DUTs in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device DUT 900 includes a first processor 910. The various embodiments of the present disclosure may also comprise a network interface within 970 such as a wireless interface so that a system embodiment may be incorporated into a wireless device, for example, cell phone or personal digital assistant.

In one embodiment, processor 910 can include one or more physical devices, such as microprocessors, application processors, microcontrollers, programmable logic devices, or other processing means. The processing operations performed by processor 910 include the execution of an operating platform or operating system on which applications and/or device functions are executed. The processing operations include operations related to I/O (input/output) with a human user or with other devices, operations related to power management, and/or operations related to connecting the computing device 900 to another device. The processing operations may also include operations related to audio I/O and/or display I/O.

In one embodiment, computing device 900 includes audio subsystem 920, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 900, or connected to the computing device 900. In one embodiment, a user interacts with the computing device 900 by providing audio commands that are received and processed by processor 910.

Display subsystem 930 represents hardware (e.g., display devices) and software (e.g., drivers) components that provide a visual and/or tactile display for a user to interact with the computing device 900. Display subsystem 930 includes display interface 932 which includes the particular screen or hardware device used to provide a display to a user. In one embodiment, display interface 932 includes logic separate from processor 910 to perform at least some processing related to the display. In one embodiment, display subsystem 930 includes a touch screen (or touch pad) device that provides both output and input to a user.

I/O controller 940 represents hardware devices and software components related to interaction with a user. I/O controller 940 is operable to manage hardware that is part of audio subsystem 920 and/or display subsystem 930. Additionally, I/O controller 940 illustrates a connection point for additional devices that connect to computing device 900 through which a user might interact with the system. For example, devices that can be attached to the computing device 900 might include microphone devices, speaker or stereo systems, video systems or other display devices, keyboard or keypad devices, or other I/O devices for use with specific applications such as card readers or other devices.

As mentioned above, I/O controller 940 can interact with audio subsystem 920 and/or display subsystem 930. For example, input through a microphone or other audio device can provide input or commands for one or more applications or functions of the computing device 900. Additionally, audio output can be provided instead of, or in addition to display output. In another example, if display subsystem 2130 includes a touch screen, the display device also acts as an input device, which can be at least partially managed by I/O controller 940. There can also be additional buttons or switches on the computing device 2100 to provide I/O functions managed by I/O controller 940.

In one embodiment, I/O controller 940 manages devices such as accelerometers, cameras, light sensors or other environmental sensors, or other hardware that can be included in the computing device 900. The input can be part of direct user interaction, as well as providing environmental input to the system to influence its operations (such as filtering for noise, adjusting displays for brightness detection, applying a flash for a camera, or other features).

In one embodiment, computing device 900 includes power management 950 that manages battery power usage, charging of the battery, and features related to power saving operation. Memory subsystem 960 includes memory devices for storing information in computing device 900. Memory can include nonvolatile (state does not change if power to the memory device is interrupted) and/or volatile (state is indeterminate if power to the memory device is interrupted) memory devices. Memory subsystem 960 can store application data, user data, music, photos, documents, or other data, as well as system data (whether long-term or temporary) related to the execution of the applications and functions of the computing device 900.

Elements of embodiments are also provided as a machine-readable medium (e.g., memory 960) for storing the computer-executable instructions. The machine-readable medium (e.g., memory 960) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 970 includes hardware devices (e.g., wireless and/or wired connectors and communication hardware) and software components (e.g., drivers, protocol stacks) to enable the computing device 900 to communicate with external devices. The computing device 900 could be separate devices, such as other computing devices, wireless access points or base stations, as well as peripherals such as headsets, printers, or other devices.

Network interface 970 can include multiple different types of connectivity. To generalize, the computing device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 974 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 980 include hardware interfaces and connectors, as well as software components (e.g., drivers, protocol stacks) to make peripheral connections. It will be understood that the computing device 900 could both be a peripheral device ("to" 982) to other computing devices, as well as have peripheral devices ("from" 984) connected to it. The computing device 900 commonly has a "docking" connector to connect to other computing devices for purposes such as managing (e.g., downloading and/or uploading, changing, synchronizing) content on computing device 900. Additionally, a docking connector can allow computing device 900 to connect to certain peripherals that allow the computing device 900 to control content output, for example, to audiovisual or other systems.

In addition to a proprietary docking connector or other proprietary connection hardware, the computing device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus comprising: a substrate having a plane; and an array of at least one conductive probe having a base affixed to the substrate, the at least one conductive probe having a major axis extending from the plane of the substrate and terminating at a tip, wherein the one or more conductive probes comprise at least three points that are non-collinear.

Example 2 includes all the features of example 1, wherein the at least one conductive probe comprises a first segment that extends from the substrate at a first angle with respect to the plane of the substrate, the first segment having a first end affixed to the substrate and a second end distal to the first end, and a second segment that extends from the second end of the first segment at a second angle that is rotated azimuthally 180 degrees from the first angle.

Example 3 includes all the features of example 2, wherein the at least one conductive probe comprises a third segment having a first end affixed to the second end of the third segment and extending therefrom at a third angle that is rotated azimuthally from the second angle, terminating at a second end.

Example 4 includes all the features of example 3, wherein the at least one conductive probe comprises a fourth segment having a first end affixed to the second end of the third segment and extending therefrom to a second end at a fourth angle that is rotated azimuthally from the third angle, terminating at a second end.

Example 5 includes all the features of any of examples 3 to 4, wherein all of the segments are coplanar.

Example 6 includes all the features of any of examples 3 to 4, wherein two or more segments are coplanar.

Example 7 includes all the features of example 1, wherein the tip of the at least one conductive probe is collinear with the base.

Example 8 includes all the features of example 1, wherein the at least one conductive probe comprises one or more curved segments.

Example 9 includes all the features of any of examples 1 or 8, wherein the one or more curved segments form a single arc.

Example 10 includes all the features of any of examples 1, 8, or 9, wherein the one or more curved segments form at least one meander.

Example 11 includes all the features of example 2, wherein the at least one conductive probe has a chevron shape.

Example 12 includes all the features of example 5, wherein the at least one conductive probe has a zig-zag shape.

Example 13 includes all the features of example 6, wherein the at least conductive probe has a twist.

Example 14 includes all the features of any of examples 8 to 10, wherein the one or more curved segments are coplanar.

Example 15 includes all the features of any of examples 8 to 10, wherein the one or more curved segments are non-coplanar.

Example 16 includes all the features of example 15, wherein the at least one conductive probe has a helical shape.

Example 17 includes all the features of example 1, wherein each wire of the array of wires comprises a chain of two or more structural units extending along the wire axis, the plane of each structural unit rotated with respect to the plane of the preceding and succeeding structural units such that the wire is helical.

Example 18 includes all the features of example 1, wherein the at least one conductive probe is bonded to a conductive trace disposed on or within the substrate.

Example 19 includes all the features of example 1, wherein the at least one conductive probe is bonded to a via embedded within the substrate.

Example 20 includes all the features of example 1, wherein the at least one conductive probe is in electrical communication with at least one electrical contact structure disposed on an externally accessible portion of the substrate.

Example 21 includes all the features of example 1, wherein the at least one conductive probe extending from the substrate is 500 microns or less in height from the base to the tip.

Example 22 includes all the features of example 1, wherein the at least one conductive probe extending from the substrate is 300 microns or less in height from the base to the tip.

Example 23 includes all the features of example 1, wherein the at least one conductive probe extending from the substrate is 100 microns or less in height from the base to the tip.

Example 24 includes all the features of example 1, wherein the array of the at least one conductive probe is regularly spaced at a pitch of 40 microns or less in at least one dimension.

Example 25 is an apparatus, comprising: a substrate having a plane, the substrate comprising one or more electrically conductive paths; and an array of at least one wire probe, the at least one wire probe has a major axis, and a first end and a second end, the first end affixed to the substrate and is coupled to the one or more electrically conductive paths, wherein the at least one wire probe comprises one or more non-linear structural segments that extend along the major axis.

Example 26 includes all the features of example 25, wherein the electrically conductive path comprises trace routing extending in or on the substrate and is electrically coupled to the at least one wire probe.

Example 27 includes all the features of example 25, wherein the electrically conductive path comprises a via extending into the substrate and is electrically coupled to the at least one wire probe.

Example 28 includes all the features of example 25, wherein the one or more non-linear structural units comprises two non-collinear wire segments, the two non-collinear wire segments having two ends and joined at a first end to form an angle subtended by the two non-collinear wire segments.

Example 29 includes all the features of example 28, wherein the two non-collinear wire segments are straight.

Example 30 includes all the features of example 29, wherein the one or more non-linear structural units have a chevron shape.

Example 31 includes all the features of example 30, wherein the at least one wire probe comprises one chevron shaped structural unit having a first end forming the base of the at least one wire probe and affixed to the substrate, the second end distal to the first end.

Example 32 includes all the features of example 29, wherein the one or more non-linear structural units comprises three non-collinear straight wire segments having a first end and a second end, wherein the first end of a first wire segment is joined to the first end of a second wire segment at a first angle, and the first end of a third wire segment is joined to the second end of the second wire segment at a second angle.

Example 33 includes all the features of any of examples 26 to 32, wherein the three non-collinear straight wire segments are coplanar.

Example 34 includes all the features of example 33, wherein the at least one probe has a zig-zag shape.

Example 35 includes all the features of any of examples 26 to 32, wherein the three non-collinear straight wire segments are non-coplanar.

Example 36 includes all the features of example 35, wherein the at least one probe wire has a spiral shape.

Example 37 includes all the features of example 30, wherein the at least one wire probe comprises two or more chevron shaped structural units, the second ends of the two non-collinear straight wire segments of the chevron shaped structural units joined together to form a chain of one or more chevron shaped structural units extending along the major axis of the at least one wire probe.

Example 38 includes all the features of example 37, wherein the two or more chevron shaped structural units are coplanar.

Example 39 includes all the features of example 37, wherein the two or more chevron shaped structural units are non-coplanar.

Example 40 includes all the features of example 39, wherein the at least one wire probe has a spiral shape.

Example 41 includes all the features of example 25, wherein the one or more non-linear structural segments has one of a C-shape or a meander-shape.

Example 42 includes all the features of example 41, wherein the one or more meander shaped non-linear structural segments is planar.

Example 43 includes all the features of example 41, wherein the one or more meander shaped non-linear structural segments is non-planar.

Example 44 includes all the features of example 41, wherein the at least one wire probe comprises a chain of one or more meander shaped non-linear segments.

Example 45 is a system, comprising: a probe station; and a probe card electrically coupled to the probe station, the probe card comprising: a substrate having a plane, the substrate comprising one or more electrically conductive paths; and an array of at least one wires probe, the at least one wire probe having a major axis, and a first end and a second end, the first end affixed to the substrate and is coupled to the one or more electrically conductive paths, wherein the at least one wire probe comprises one or more non-linear structural segments that extend along the major axis.

Example 46 is a method comprising: providing a substrate having a surface, the surface having conductive portions; depositing a first thick resist layer on the surface of the substrate, the first thick resist layer having a top surface; patterning the first thick resist with a plurality of apertures extending at a first non-perpendicular angle from the conducting portions of the substrate surface to the top of the first thick resist layer; depositing a first electrically conductive metal into the plurality of apertures forming a first plurality of slanted wires, the first plurality of slanted wires bonded to the conducting portions of the substrate surface and extending to the top of the first thick resist layer and planar therewith; depositing a second thick resist layer on the top surface of the first thick resist layer, the second thick resist layer has a top surface; patterning the second thick resist layer with a second plurality of apertures extending at a second non-perpendicular angle from the tops of the first plurality of wires to the top surface of the second thick resist layer; and depositing a second electrically conductive metal into the second plurality of apertures forming a second plurality of slanted wires, the second plurality of slanted wires boned to the tops of the first plurality of slanted wires.

Example 47 includes all the features of example 46, further comprising removing the first and second thick resist layers.

Example 48 includes all the features of example 46, wherein the first electrically conductive metal is selected from the group consisting high strength metals/alloys, which can include copper, copper beryllium alloy, tungsten, tungsten alloys.

Example 49 includes all the features of example 46, wherein the first non-perpendicular angle is coplanar with the second microfabrication angle.

Example 50 includes all the features of example 46, wherein the first non-perpendicular angle is non-coplanar with the second microfabrication angle.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An apparatus comprising:
a substrate comprising conductive features; and
a plurality of conductive probes projecting from a plane of the substrate, wherein:
a base of individual ones of the probes is coupled with corresponding ones of the conductive features;
individual ones of the probes comprise a first straight segment extending a first distance from the base to a first end in a first direction over the plane of the substrate and at a first zenith angle oblique to the plane of the substrate; and
the individual ones of the probes comprise a second straight segment comprising a second end in direct contact with the first end, the second straight segment extending from the second end a second distance in a second direction over the plane of the substrate and at a second zenith angle oblique to the plane of the substrate, wherein the second direction differs from the first direction by a non-zero azimuth angle.

2. The apparatus of claim 1, wherein the substrate comprises a dielectric material and conductive features, and wherein the base of individual ones of the probes is coupled to a corresponding one of the conductive features.

3. The apparatus of claim 1, wherein individual ones of the probes have a major axis from the base to a tip that extends no more than 500 microns in a direction substantially orthogonal to the plane of the substrate.

4. The apparatus of claim 3, wherein the major axis extends from the base to the tip by 100 microns, or less.

5. The apparatus of claim 3, wherein the plurality of probes have a pitch of no more than 100 microns in at least one dimension over the plane of the substrate.

6. The apparatus of claim 5, wherein the pitch is 40 microns, or less.

7. The apparatus of claim 1, wherein the second direction is substantially opposite the first direction, with the first and second segments substantially co-planar.

8. The apparatus of claim 1, wherein the first and second distances are substantially equal with individual ones of the probes having a chevron shape.

9. The apparatus of claim 1, wherein the first and second zenith angles are substantially equal.

10. The apparatus of claim 1, wherein individual ones of the probes comprise a third straight segment in direct contact with the second straight segment, the third straight segment extending in a third direction over the plane of the substrate, wherein the third direction differs from the second direction by a non-zero azimuth angle.

11. The apparatus of claim 10, wherein the third direction is rotated azimuthally toward the base.

12. The apparatus of claim 1, wherein the probes comprise copper or tungsten.

13. A system comprising:
a probe station; and
a probe card electrically coupled to the probe station wherein, the probe card comprises a plurality of conductive probes projecting from a plane of a probe card substrate, and wherein individual ones of the probes comprise:
  a first straight segment extending a first distance from a base to a first end in a first direction over the plane of the substrate and at a first zenith angle oblique to the plane of the substrate; and
  a second straight segment comprising a second end in direct contact with the first end, the second straight segment extending from the second end a second distance in a second direction over the plane of the substrate and at a second zenith angle oblique to the plane of the substrate, wherein the second direction differs from the first direction by a non-zero azimuth angle.

14. The system of claim 13, wherein:
the substrate comprises trace routing coupling the probe station to individual ones of the conductive probes;
the probes comprise copper or tungsten;
individual ones of the probes have a major axis from the base to a tip that extends no more than 500 microns in a direction substantially orthogonal to the plane of the substrate; and
the probes have a pitch of no more than 100 microns in at least one dimension over the plane of the substrate.

15. The system of claim 14, wherein:
the major axis extends from the base to the tip by 100 microns, or less; and
the pitch is 40 microns, or less.

16. The system of claim 13, wherein the second direction is substantially opposite the first direction, with the first and second segments substantially co-planar.

17. A method of electrically testing an integrated circuit (IC) device, the method comprising:
receiving a device under test (DUT);
contacting test points on the DUT with a plurality of probes; and
performing an electrical test of the DUT with a probe station coupled to the probes, wherein the plurality of probes project from a plane of a probe card substrate, and wherein individual ones of the probes comprise:
  a first straight segment extending a first distance from a base to a first end in a first direction over the plane of the substrate and at a first zenith angle oblique to the plane of the substrate; and
  a second straight segment comprising a second end in direct contact with the first end, the second straight segment extending from the second end a second distance in a second direction over the plane of the substrate and at a second zenith angle oblique to the plane of the substrate, wherein the second direction differs from the first direction by a non-zero azimuth angle.

18. The method of claim 17, wherein:
individual ones of the probes have a major axis from the base to a tip that extends no more than 500 microns in a direction substantially orthogonal to the plane of the substrate; and
the probes have a pitch of no more than 100 microns in at least one dimension over the plane of the substrate.

19. The method of claim 18, wherein the first and second distances are substantially equal with individual ones of the probes having a chevron shape.

20. The method of claim 19, wherein the major axis extends from the base to the tip by 100 microns, or less, and the pitch is 40 microns, or less.

* * * * *